United States Patent [19]

Bae

[11] Patent Number: 5,742,363
[45] Date of Patent: Apr. 21, 1998

[54] LIQUID CRYSTAL DISPLAY AND METHOD FOR FABRICATING THE SAME IN WHICH THE GATE ELECTRODE IS FORMED FROM TWO LAYERS HAVING DIFFERING WIDTHS

[75] Inventor: Sung-Sik Bae, Seoul, Rep. of Korea

[73] Assignee: LG Electronics Inc., Seoul, Rep. of Korea

[21] Appl. No.: 700,789

[22] Filed: Aug. 21, 1996

[30] Foreign Application Priority Data

Aug. 22, 1995 [KR] Rep. of Korea ............... 25950/1995

[51] Int. Cl.⁶ .................. G02F 1/1343; G02F 1/136; G02F 1/13; H01L 29/76
[52] U.S. Cl. .................. 349/38; 349/39; 349/43; 349/46; 349/47; 349/187; 257/336; 257/344
[58] Field of Search .................. 349/38, 39, 43, 349/46, 47, 187; 257/336, 344

[56] References Cited

U.S. PATENT DOCUMENTS

| | | | |
|---|---|---|---|
| 5,187,602 | 2/1993 | Ikeda et al. | 349/39 |
| 5,384,479 | 1/1995 | Taniguchi | 257/768 |
| 5,543,646 | 8/1996 | Satoh et al. | 257/344 |

*Primary Examiner*—William L. Sikes
*Assistant Examiner*—Walter Malinowski
*Attorney, Agent, or Firm*—Morgan, Lewis & Bockius LLP

[57] ABSTRACT

A liquid crystal display having a thin film transistor includes a substrate, an active layer formed over the substrate, the active layer having a channel region, source and drain regions, and an offset region, a gate insulating layer formed on the active layer, a lower gate electrode formed on the gate insulating layer, and an upper gate electrode formed on the lower gate electrode, wherein the lower and upper gate electrode are different in width.

35 Claims, 10 Drawing Sheets

LIQUID CRYSTAL DISPLAY AND METHOD FOR FABRICATING THE SAME IN WHICH THE GATE ELECTRODE IS FORMED FROM TWO LAYERS HAVING DIFFERING WIDTHS

BACKGROUND OF THE INVENTION

1. Field of the Invention

The present invention relates to a liquid crystal display (LCD) and a method for fabricating the same, and more particularly, to a liquid crystal display having a thin film transistor (TFT) and a storage capacitor and a method for fabricating the same.

2. Description of Prior Art

Figure 1:
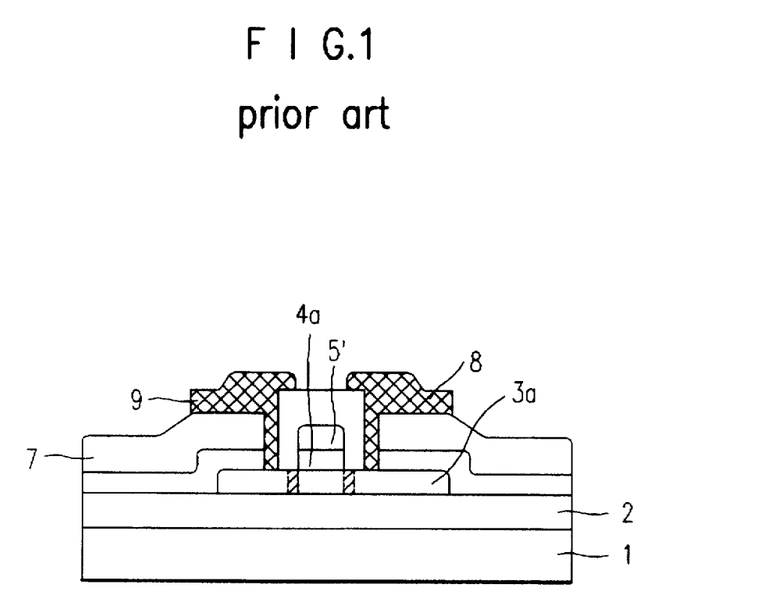
FIG. 1 is a cross-sectional view of a thin film transistor having an offset region according to a conventional liquid crystal display.
Figure 2A:
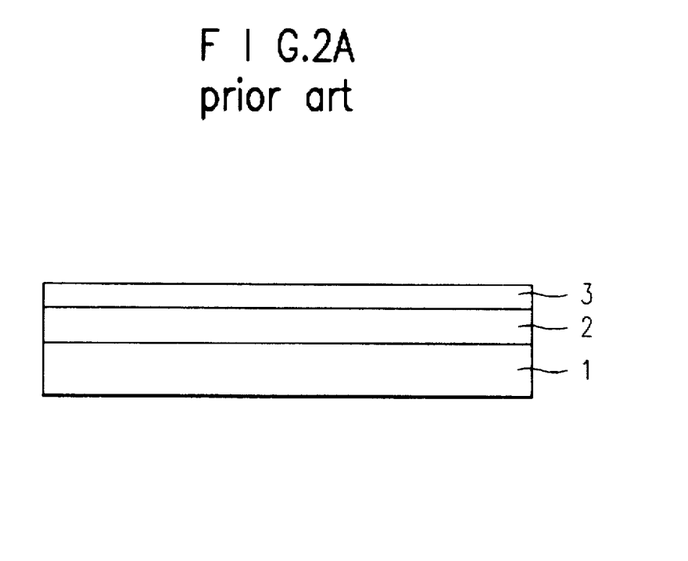
FIGS. 2A to 2E are cross-sectional views showing the method for fabricating the thin film transistor having an offset region according to a conventional liquid crystal display.
Figure 2B:
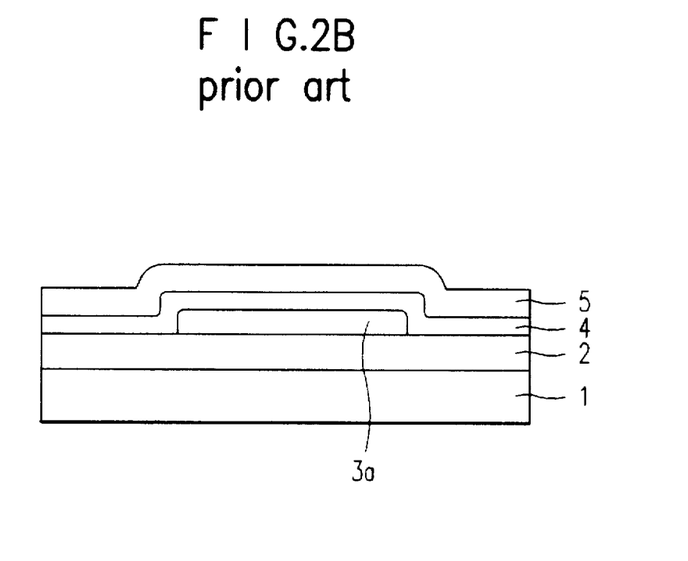

FIG. 1 is a cross-sectional view of a conventional liquid crystal display having an offset-type polysilicon thin film transistor. A method for fabricating the conventional liquid crystal display having the offset-type polysilicon thin film transistor will be explained below with reference to FIGS. 2A to 2E. As shown in FIG. 2A, a buffer layer 2 and a polysilicon layer 3 are sequentially formed on a substrate 1. Then, as shown in FIG. 2B, the polysilicon layer 3 is patterned through photolithography to form an active layer 3a. An insulating layer 4 and a conductive layer 5 are sequentially formed on the overall surface of the substrate.

Figure 2C:
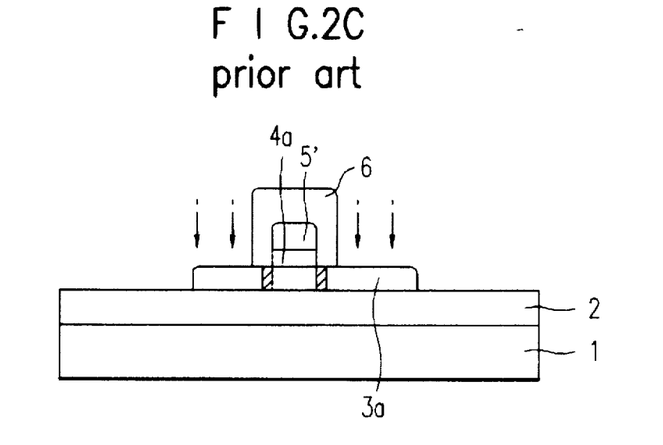

As shown in FIG. 2C, the conductive layer 5 and the insulating layer 4 are patterned to form a gate electrode 5' and a gate insulating layer 4a, respectively. Then, a photoresist is coated on the substrate, and selectively exposed and developed to form a photoresist pattern 6. Ion-doping is carried out into active layer 3ausing photoresist pattern 6 as a mask, to form source and drain regions in a predetermined portion of the active layer 3a. Here, a portion of active layer 3aat both sides of gate 5' on which photoresist pattern 6 remains defines offset regions.

Figure 2D:
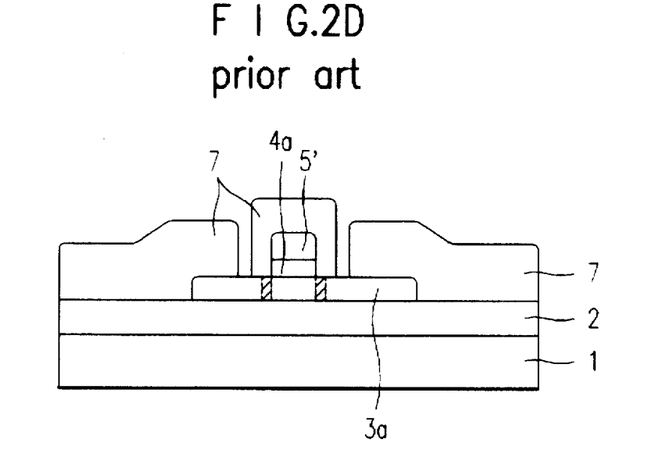

As shown in FIG. 2D, the photoresist pattern is removed. Then, an interlayer insulating layer 7 is formed on the overall surface of the substrate, and selectively etched to form a contact hole partially exposing the source and drain regions of active layer 3a.

Figure 2E:
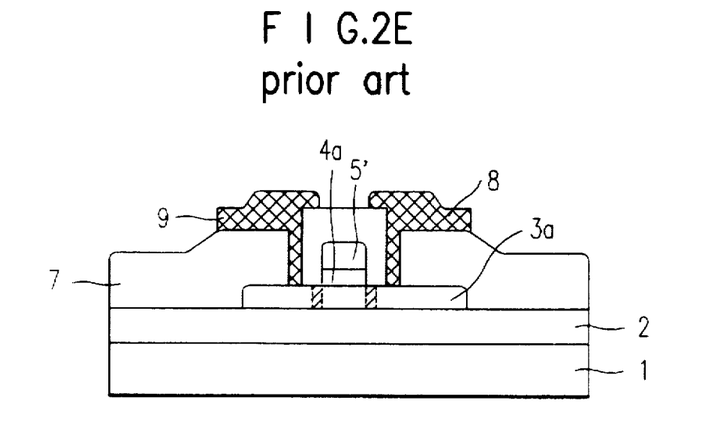

As shown in FIG. 2E, a metal is deposited on interlayer insulating layer 7 including the contact hole, and patterned into a predetermined pattern to form source and drain electrodes 8 and 9 connected to the source and drain regions of active layer 3a.

The aforementioned conventional offset-type polysilicon thin film transistor requires that a mask pattern be formed (photoresist pattern 6) on the gate electrode 5' in order to form the offset regions. Accordingly, an additional mask for photolithography is needed. Also, a misalignment during the formation of the mask pattern may occur. Therefore, the sizes of the offset regions may become different.

SUMMARY OF THE INVENTION

Accordingly, the present invention is directed to a liquid crystal display and method for fabricating the same that substantially obviates one or more of the problems due to limitations and disadvantages of the related art.

An object of the present invention to provide a liquid crystal display having thin film transistors and a method for fabricating the same that are capable of forming an offset region without using an additional mask.

Another object of the present invention is to provide a thin film transistor capable of preventing electrical shorts using a double gate structure and reducing leakage current.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the liquid crystal display and method for fabricating the same includes an insulating substrate; an active layer formed on the insulating layer, the active layer having a heavily doped impurity region in a predetermined portion; a gate insulating layer formed on the active layer; lower and upper gate electrodes sequentially formed on the gate insulating layer; the lower and upper gate electrodes having different widths from each other; an interlayer insulating layer having a contact hole to expose the heavily doped impurity region of the active layer, the interlayer insulating layer being formed on the overall surface of the substrate except the contact hole; and source and drain electrodes connected to the heavily doped impurity region of the active layer through the contact hole.

In another aspect, the present invention provides a method for fabricating a liquid crystal display including the steps of forming an active layer on an insulating substrate; forming a gate insulating layer on the overall surface of the insulating substrate on which the active layer is formed; sequentially forming first and second conductive layers on the gate insulating layer; selectively etching the first and second conductive layers; to simultaneously form first and second gate patterns; over-etching the first conductive layer using the second gate pattern as a mask, to form a upper gate electrode formed of the second gate pattern and a lower gate electrode formed of first gate pattern; forming a gate insulating layer pattern using the upper gate electrode as a mask; forming a heavily doped impurity region in an exposed portion of the active layer; forming an interlayer insulating layer on the overall surface of the insulating substrate; selectively etching the interlayer insulating layer, to form a contact hole to expose the heavily doped impurity region of the active layer; forming a metal layer on the overall surface of the interlayer insulating layer; and patterning the metal layer to form source and drain electrodes to be connected to the heavily doped impurity region.

In another aspect, the present invention provides a thin film transistor comprising a substrate; an active layer over the substrate, the active layer having a channel region, source and drain regions, and an offset region a gate insulating layer over the active layer; a lower gate electrode having first width over the gate insulating layer; and an upper gate electrode over the lower gate electrode, the second width being different from the first width.

In another aspect, the present invention provides a method for fabricating a liquid crystal display including a thin film transistor having a substrate, the method comprising the steps of forming an active layer on the substrate; forming an insulating layer on the substrate and the active layer; forming a first conductive layer on the insulating layer; forming a second conductive layer over the first conductive layer; selectively etching the first and second conductive layers to form lower and upper gate electrodes; and doping impurities in the active layer to form source and drain regions for the thin film transistor by using the upper gate electrode as a mask.

In another aspect, the present invention provides a method for fabricating a liquid crystal display having a thin film transistor and a storage capacitor, the method comprising the steps of forming an active layer on a substrate; forming an insulating layer on the substrate and the active layer; forming a first conductive layer on the insulating layer; forming a second conductive layer over the first conductive layer; selectively etching the first and second conductive layers to form lower and upper gate electrodes and first and second storage electrodes; doping impurities in the active layer to form source and drain regions for the thin film transistor by using the upper gate electrode as a mask; forming an interlayer insulating layer over a first overall surface of the substrate; selectively etching the interlayer insulating layer to form a contact hole exposing a portion of the source and drain regions; forming a metal layer over an overall surface of the interlayer insulating layer; patterning the metal layer to form source and drain electrodes connected to the source and drain regions through the contact hole, and to form an upper storage electrode; forming a protective layer over a second overall surface of the substrate; selectively etching portions of the protective layer to expose a portion of one of the source and drain electrodes and the upper storage electrode; and forming a pixel electrode on the protective layer including the selectively etched portions of the protective layer.

In a further aspect, the present invention provides a liquid crystal display comprising a thin film transistor section including: a substrate; an active layer over the substrate, the active layer having a channel region, source and drain regions, and an offset region; a first insulating layer portion over the active layer; a lower gate electrode having a first width over the first insulating layer portion; and an upper gate electrode having a second width over the lower gate electrode, the second width being different from the first width; a storage capacitor section adjacent the thin film transistor section including: the substrate; a second insulating layer portion over the substrate; a first storage electrode having a third width over the second insulating layer portion; and a second storage electrode having a fourth width over the first storage electrode, the fourth width being different from the third width; an interlayer insulating layer on an overall surface of the substrate including the active layer, the insulating layer, the lower and upper gate electrodes, and the first and second storage electrodes, the interlayer insulating layer having first contact holes exposing the source and drain regions of the active layer, respectively; source and drain electrodes on the interlayer insulating layer and connected to the source and drain regions through the first contact holes; an upper storage electrode on the interlayer insulating layer over the first and second storage electrodes; a protective layer over the interlayer insulating layer, the source and drain electrodes, and the upper storage electrode, the protective layer having second contact holes to expose a portion of one of the source and drain electrodes an a portion of the upper storage electrode; and a conducting material on the protective layer and contacting the portion of the one of the source and drain electrodes and the portion of the upper storage electrode through the second contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 3:
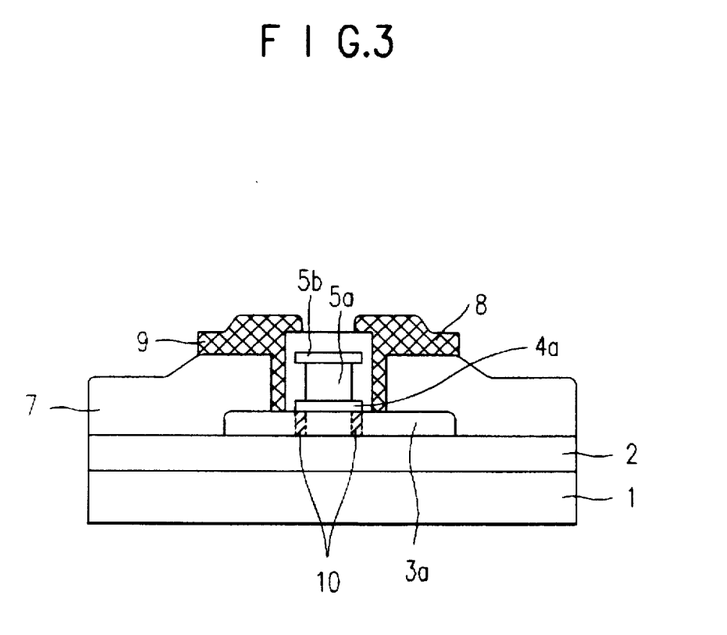
FIG. 3 is a cross-sectional view of a thin film transistor having an offset region for a liquid crystal display according to a first embodiment of the present invention.

FIG. 3 is a cross-sectional view of a polysilicon thin film transistor having an offset region for a liquid crystal display according to a first embodiment of the present invention. A buffer layer 2 is formed on a substrate 1, and an active layer 3a is formed on buffer layer 2. The active layer 3a has a channel region, an offset regions 10 formed on both sides of the channel region, and source and drain regions formed on both sides of the offset regions 10. A gate insulating layer 4a, a lower gate electrode 5a and an upper gate electrode 5b are sequentially formed on the active layer 3a. Then, an interlayer insulating layer 7 is formed on the active layer 3a and the lower and upper gate electrodes 5a and 5b. The interlayer insulating layer 7 has a contact hole to expose the source and drain regions of the active layer 3a. Through the contact hole, source and drain electrodes 8 and 9 are connected to the source and drain regions, respectively.

The upper gate electrode 5b is wider than the lower gate electrode 5a. Thus, a portion of the upper gate electrode 5b protrudes from the edge of the lower gate electrode 5a. The offset regions 10 are formed in a portion of active layer 3a located below the protruding portion of the upper gate electrode 5b.

Figure 4A:
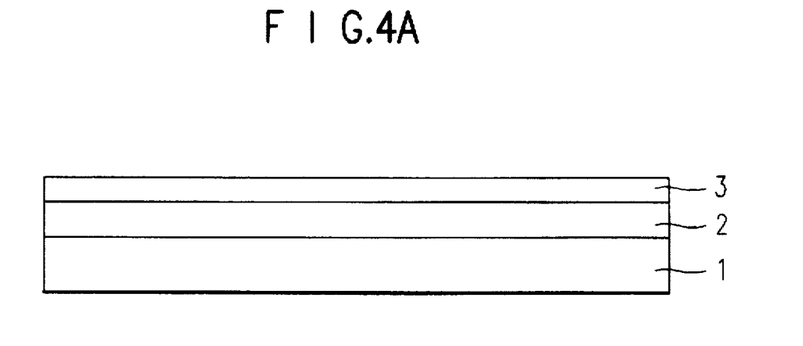
FIGS. 4A to 4H are cross-sectional views showing a method for fabricating the thin film transistor having an offset region for a liquid crystal display according to a second embodiment of the present invention.
Figure 4B:
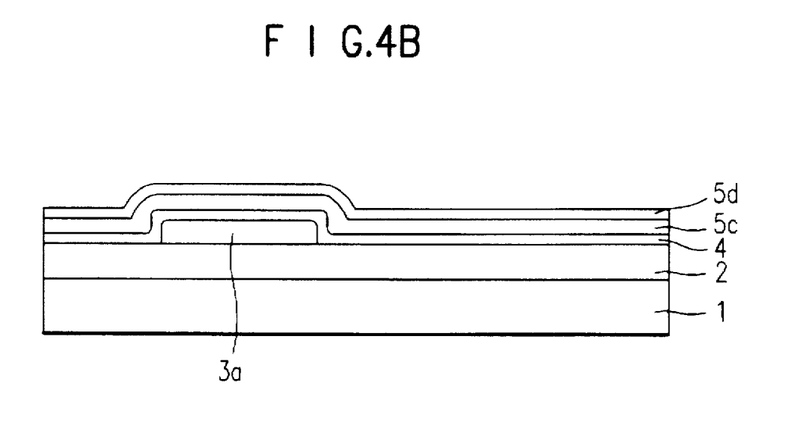

A method for fabricating a liquid crystal display according to a second embodiment of the present invention will be explained below with reference to FIGS. 4A to 4H. In this embodiment, while the structure of the TFT is similar to that of the first embodiment, a storage capacitor is also fabricated at the same time. As shown in FIG. 4A, a buffer layer 2 is formed on an insulating substrate 1, and a semiconductor layer 3, such as a polysilicon layer, is formed on the buffer layer 2. Then, as shown in FIG. 4B, the semiconductor layer 3 is patterned through photolithography to form an active layer 3a, and an insulating layer 4 is formed thereon. First and second conductive layers 5c and 5d are sequentially formed on the insulating layer 4.

Figure 4C:
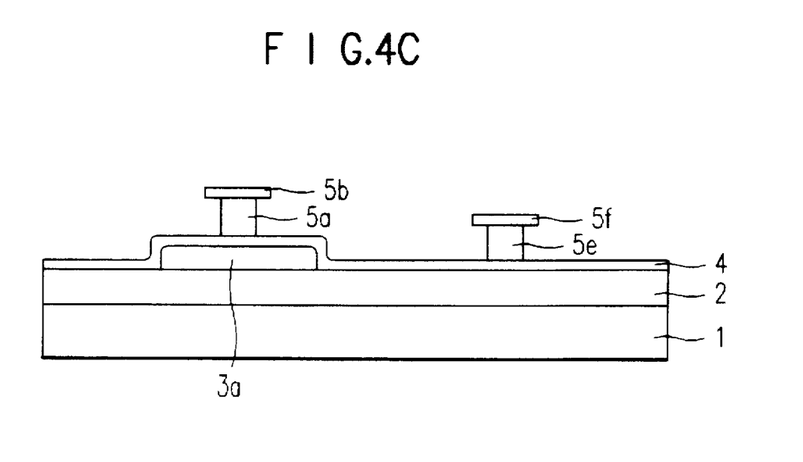

A photoresist (not shown) is coated on second conductive layer 5d, and patterned through photolithography to form a photoresist pattern for forming a gate electrode and a storage electrode. The gate electrode (including upper and lower gate electrodes) and the storage electrode including first and second storage electrodes) are formed by etching the first and second conductive layers 5c and 5d using the photoresist pattern as a mask. First, an upper gate electrode 5b and a first storage electrode 5f are formed by etching the second conductive layer 5d. Then, the first conductive layer 5c is etched to form a lower gate electrode 5a and a second storage electrode 5e. Here, materials of the first and second conductive layers 5c and 5d and the etching method are chosen such that the etch selectivity of the first conductive layer 5c is higher as compared to the second conductive layer 5d. Therefore, the first conductive layer 5c is etched more than ("over-etched") the second conductive layer 5d. As a result, the gate electrode (5a, 5b) and the storage electrode (5e, 5f) have shapes as shown in FIG. 4C. Thus, the double structured gate including upper and lower gate electrodes 5b and 5a are formed. Examples of the materials for the first and second conductive layers 5c and 5d include Al, TiSi$_2$, Cr, Ta and Mo.

Figure 4D:
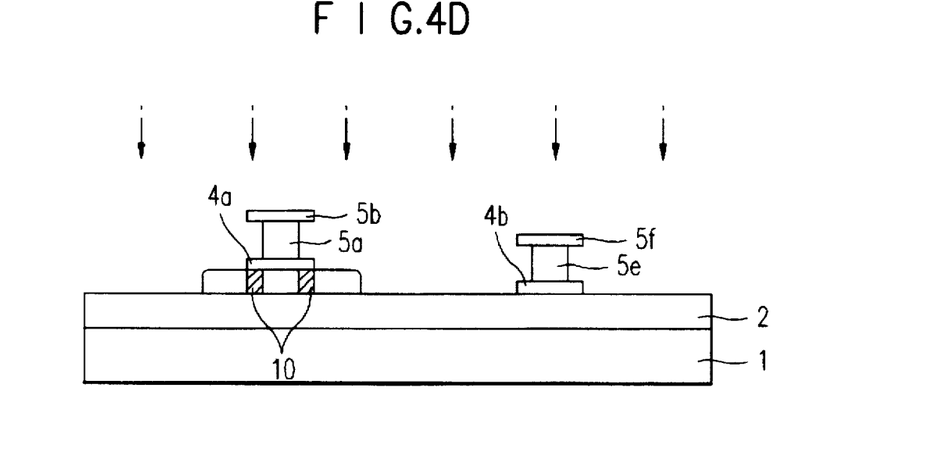

As shown in FIG. 4D, after the photoresist pattern is removed, the insulating layer 4 is dry or wet etched to form a gate insulating layer 4a and an insulating pattern 4b using the upper gate electrode 5b and the first storage electrode 5f as a mask. Alternatively, the insulating layer 4 can be etched before the photoresist pattern is removed. In that case, the photoresist pattern can be used as a mask to etch the insulating layer 4. Also, the first conductive layer 5c and the insulating layer 4 can be sequentially etched after forming the upper gate electrode 5b. In that case, either the photoresist patterns formed on the upper gate electrode 5b and the first storage electrode 5f, or the upper gate electrode 5b and the first storage electrode 5f themselves serve as a mask. The etch selectivity among these three layers are chosen such that only the first conductive layer 5c is over-etched.

Next, ion-doping is carried out into an exposed portion of the active layer 3a to form source and drain regions. The ion-doping is performed using an ion shower or ion doping apparatus. Then, offset regions 10 are formed in the active layer 3a, which has a width corresponding to the difference in width between the upper gate electrode 5b and the over-etched lower gate electrode 5a. Thus, the width of the offset region is controlled simply by the amount of the over-etch of the lower gate electrode. Therefore, an additional mask is not necessary.

Figure 4E:
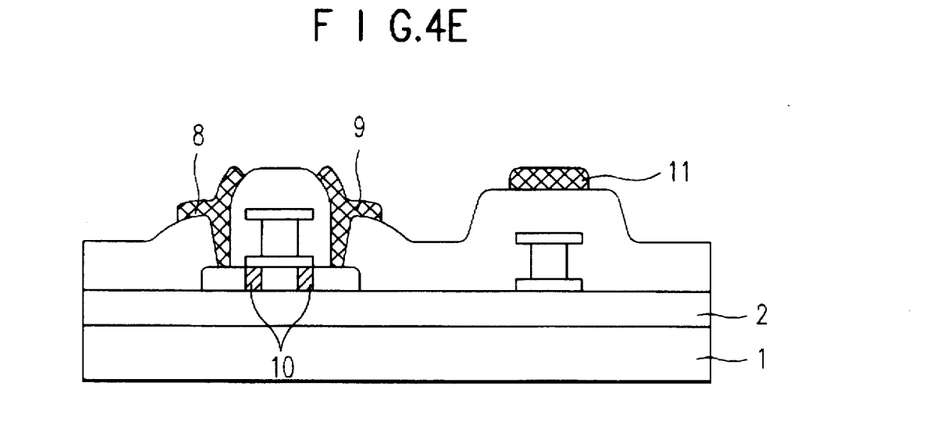

As shown in FIG. 4E, an interlayer insulating layer 7, for example, SiO$_2$ or SiN$_4$, is formed on the overall surface of the substrate through Chemical Vapor Deposition (CVD), and then selectively etched to form a contact hole exposing the source and drain regions of the active layer 3a. Here, when the upper and lower gate electrodes 5b and 5a are formed of Aluminum (Al) and Chromium (Cr), respectively, and the interlayer insulating layer 7 is formed of SiO$_2$ by CVD, the formation of Aluminum hillock can be avoided. Thereafter, an upper storage electrode 11, and source and drain electrodes 8 and 9 are formed of a material such as metal on the interlayer insulating layer 7 in the predetermined positions shown in FIG. 4E. The upper storage electrode 11, and the source and drain electrodes 8 and 9 can be formed of different materials, however. The source and drain electrodes 8 and 9 are in contact with the source and drain regions of the active layer 3a.

Figure 4F:
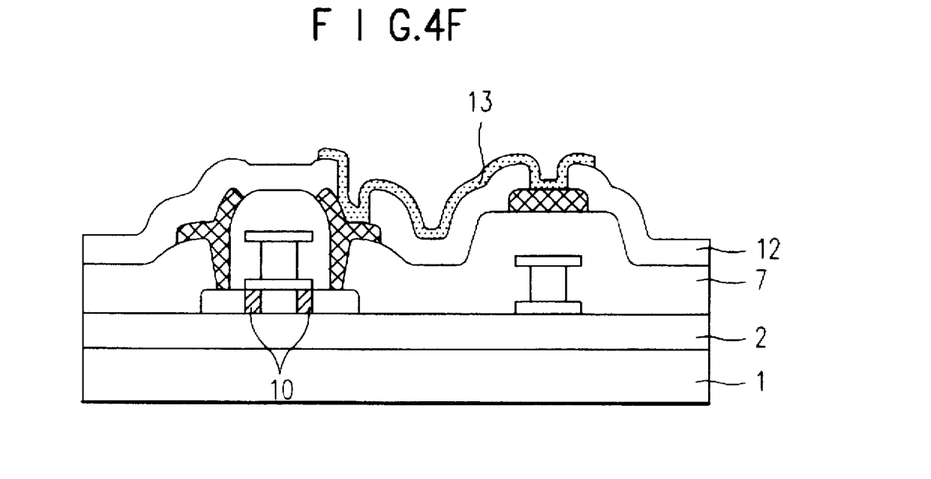

Then, as shown in FIG. 4F, a protective layer 12 is formed on the overall surface of the substrate and selectively etched to form contact holes exposing the drain region and the upper storage electrode 11. A transparent conductive film, such as indium tin oxide (ITO), is deposited thereon and patterned to form a pixel electrode 13. The materials for the protective layer 12 and the upper storage electrode 11 and the etching method are chosen such that the etch selectivity of the protective layer 12 to the upper storage electrode 11 is high. Thus, it is possible to prevent the upper storage electrode 11 from being etched unnecessarily or undesirably.

The above-described process for forming the TFT and the storage capacitor may be carried out without forming the storage capacitor. In that case, the resultant structure is identical to the TFT structure shown in FIG. 3. Moreover, when the lower storage electrode is formed using the aforementioned process as in this embodiment, an electrical short can be prevented because the storage electrode has a double-level structure. Also, the conventional technique uses the gate insulating layer as the insulating layer for the storage capacitor. In this embodiment, the interlayer insulating layer (for example, Si$_3$N$_4$) having a dielectric constant higher than that of the gate insulating layer (for example, SiO$_2$) can be used as the insulating layer for the storage capacitor, and the characteristic of the storage capacitor can be stabilized.

As described above, the present invention forms the offset structure using the double gate electrodes, without using an additional mask. Also, since the offset structure is used, the leakage current is decreased. Furthermore, it is possible to prevent an electrical short using the double gate electrode to improve the performance of the thin film transistor, and increase the yield in the fabrication of the thin film transistor.

Figure 4G:
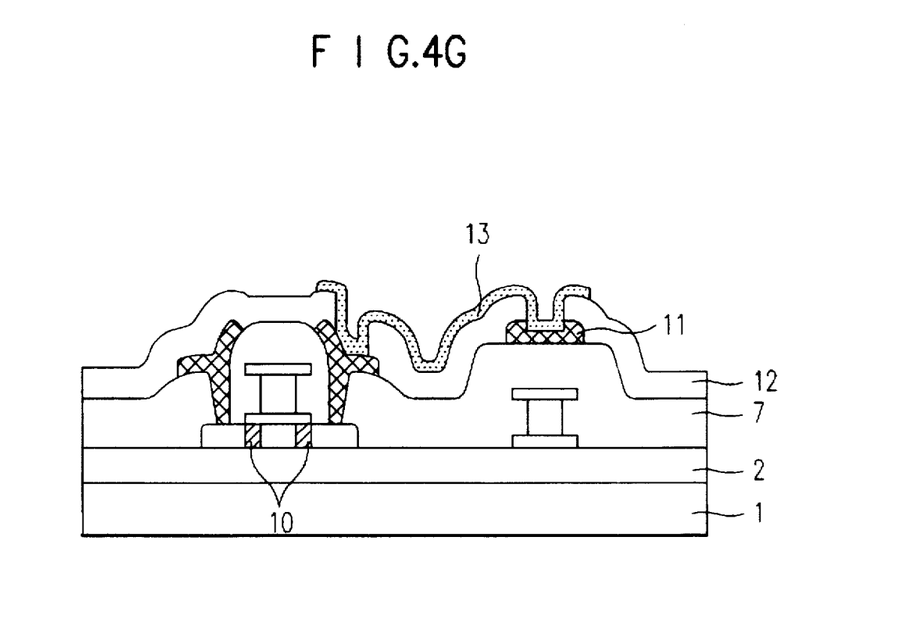

FIG. 4G shows another structure for the storage capacitor according to the second embodiment of the present invention. In this case, a portion of the upper storage electrode is removed and the pixel electrode 13 fills the removed portion of the upper storage electrode 11, and preferably, to about one-half the distance into the upper storage electrode 11.

Figure 4H:
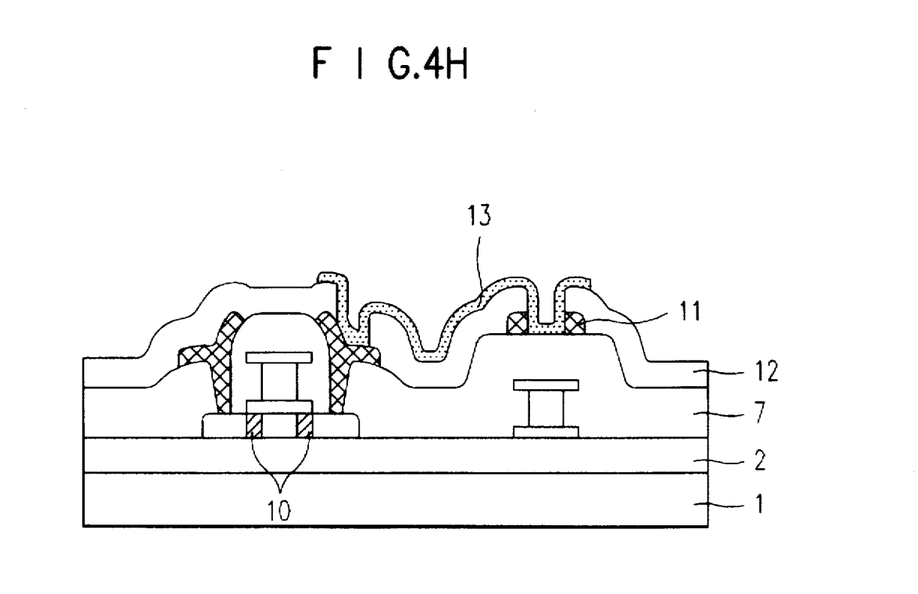

FIG. 4H shows still another structure for the storage capacitor according to the second embodiment of the present invention. In this case, a hole is formed by etching, for example, in the upper storage electrode 11 to expose a portion of the interlayer insulation layer 7, and the pixel electrode 13 goes through the hole to the interlayer insulating layer 7. The materials of the interlayer insulating layer 7 and the upper storage electrode 11 and/or the etching method are preferably chosen such that the etch selectivity of the upper storage electrode 11 to the interlayer insulating layer 7 is high. Thus, it is possible to etch through the upper storage electrode 11 (forming the hole) and up to the interlayer insulating layer 7.

Figure 5A:
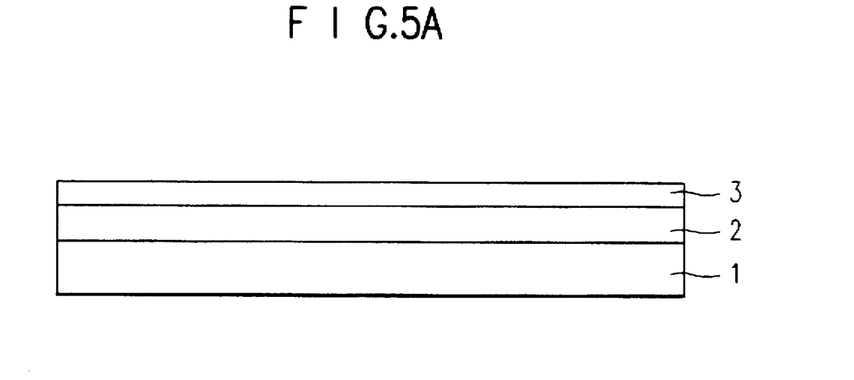
FIGS. 5A to 5H are cross-sectional views showing a method for forming a storage electrode for the liquid crystal display according to a third embodiment of the present invention.
Figure 5B:
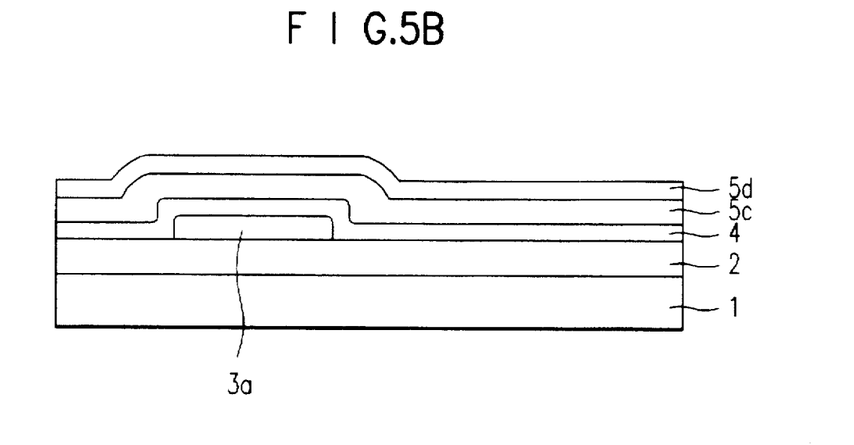

A method for fabricating a liquid crystal display according to a third embodiment of the present invention will be explained below with reference to FIGS. 5A to 5H. As shown in FIG. 5A, a buffer layer 2 is formed on an insulating substrate 1, and a semiconductor layer 3, such as a polysilicon layer, is formed on the buffer layer 2. Then, as shown in FIG. 5B, the semiconductor layer 3 is patterned through photolithography to form an active layer 3a, and an insulating layer 4 is formed thereon. First and second conductive layers 5c and 5d are sequentially formed on the insulating layer 4.

A photoresist (not shown) is coated on second conductive layer 5d, and patterned through photolithography to form a photoresist pattern for forming a gate electrode and a storage electrode. The gate electrode and the storage electrode are formed by etching the first and second conductive layers 5c and 5d using the photoresist pattern as a mask. First, an upper gate electrode 5b and a first storage electrode 5f are formed by etching the second conductive layer 5d. Then, the first conductive layer 5c is etched to form a lower gate electrode 5a and a second storage electrode 5e.

Figure 5C:
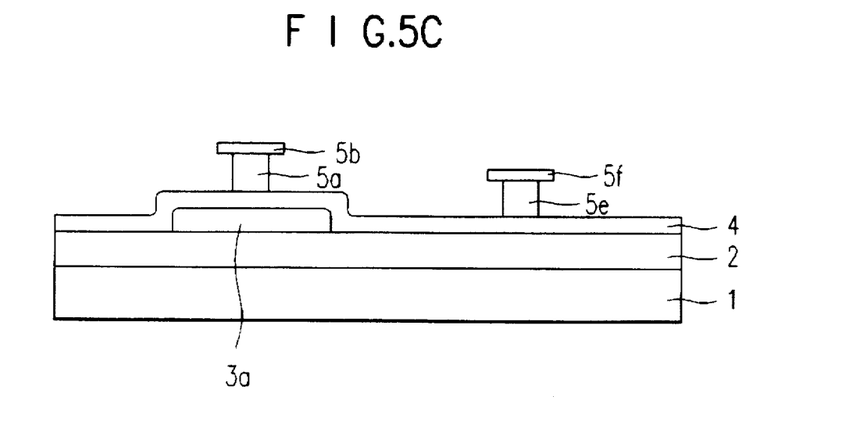

The materials of the first and second conductive layers 5c and 5d and the etching method are chosen such that the etch selectivity of the first conductive layer 5c to the second conductive layer 5d is high. Therefore, the first conductive layer 5c is etched more than the second conductive layer 5d. As a result, the gate electrode (5a, 5b) and the storage electrode (5e, 5f) have shapes as shown in FIG. 5C. Thus, the double structured gate including upper and lower gate electrodes 5b and 5a are formed. Examples of the materials for the first and second conductive layers 5c and 5d include Al, TiSi$_2$, Cr, Ta and Mo.

Figure 5D:
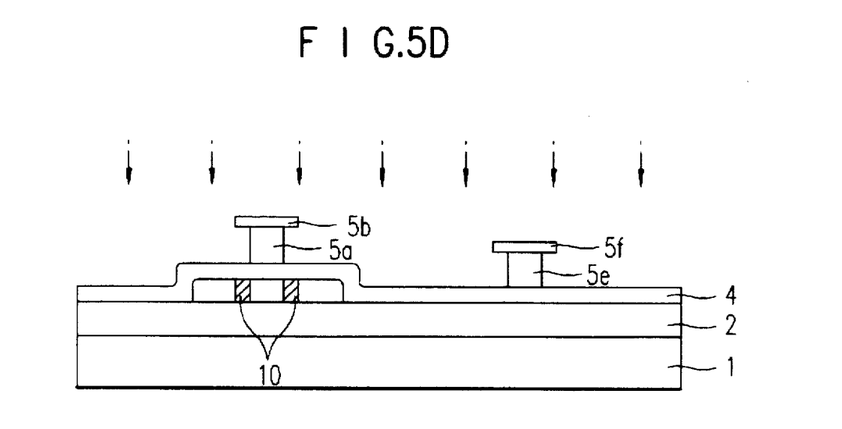

As shown in FIG. 5D, after the photoresist pattern is removed, ion-implantation is carried out. The ion-doping is performed using an ion implantation apparatus. This way, offset regions 10 are formed in the active layer 3a, which has a width corresponding to the difference in width between the upper gate electrode 5b and the over-etched lower gate electrode 5a. The width of the offset region is controlled simply by the amount of the over-etched portion of the lower gate electrode 5a. Therefore, an additional mask is not necessary.

Figure 5E:
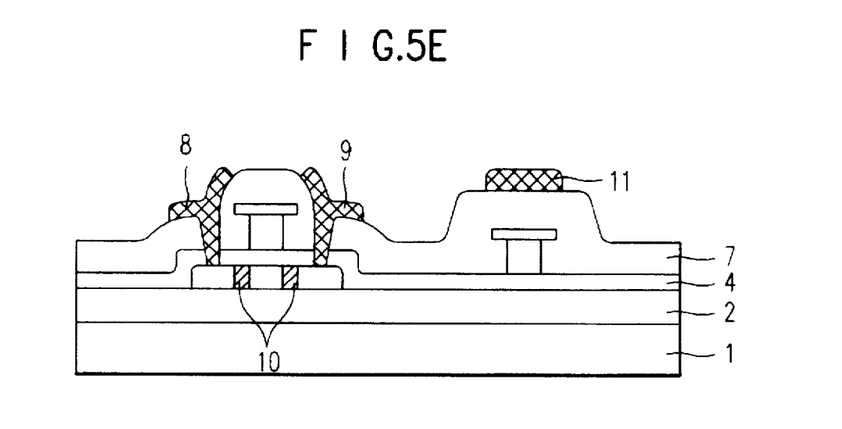

As shown in FIG. 5E, an interlayer insulating layer 7, for example, SiO$_2$ or SiN$_4$, is formed on the overall surface of the substrate through Chemical Vapor Deposition (CVD), and then selectively etched to form a contact hole exposing the source and drain regions of active layer 3a. Here, the insulating layer 4 is also etched. Thus, the upper and lower gate electrodes 5b and 5a are preferably formed of Aluminum (Al) and Chromium (Cr), respectively, and the interlayer insulating layer 7 is preferably formed of SiO$_2$ by CVD. Using these materials prevents the formation of aluminum hillock.

Thereafter, an upper storage electrode 11, and source and drain electrodes 8 and 9 are formed of a conductive material such as metal on the interlayer insulating layer 7 in the predetermined positions shown in FIG. 5E. The upper storage electrode 11, and the source and drain electrodes 8 and 9 can be formed of different materials, however. The source and drain electrodes 8 and 9 are in contact with the source and drain regions of the active layer 3a.

Figure 5F:
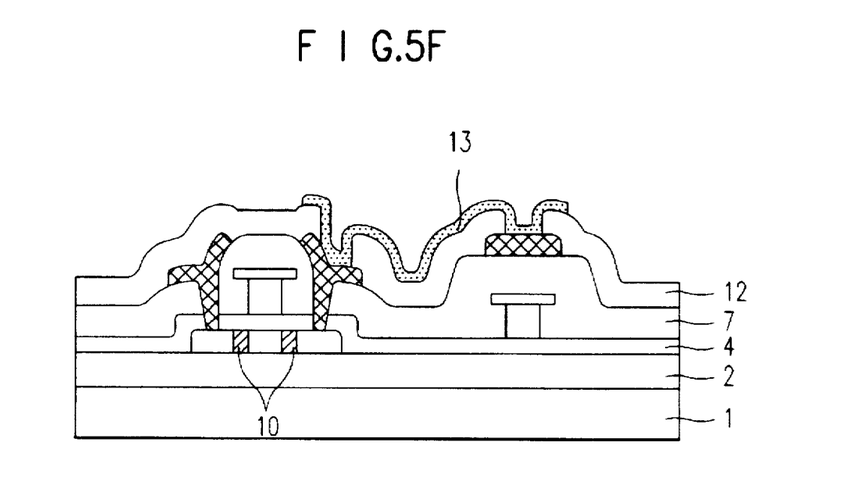

Then, as shown in FIG. 5F, a protective layer 12 is formed on the overall surface of the substrate and selectively etched to form contact holes exposing the drain region and the upper storage electrode 11. A transparent conductive film, such as indium tin oxide (ITO), is deposited thereon and patterned to form a pixel electrode 13. The materials for the protective layer 12 and the upper storage electrode 11 and the etching method are chosen such that the etch selectivity of the protective layer 12 to the upper storage electrode 11 is high. Thus, it is possible to prevent the upper storage electrode 11 from being over-etched.

The above-described process for forming the TFT and the storage capacitor may be carried out without forming the storage capacitor. When the lower storage electrode is formed using the aforementioned process as in this embodiment, an electrical short can be prevented because the storage electrode has a double-level structure. Also, the conventional technique uses the gate insulating layer as the insulating layer for a storage capacitor. In this embodiment, the interlayer insulating layer (for example, Si$_3$N$_4$) having a dielectric constant higher than that of the gate insulating layer (for example, SiO$_2$) can be used as the insulating layer for the storage capacitor, which allows a stable characteristic of the storage capacitor.

As described above, the present invention forms the offset structure using the double gate electrodes, without using an additional mask. Also, since the offset structure is used, the leakage current decreases. Furthermore, it is possible to prevent an electrical short using the double gate electrodes to improve the performance of the thin film transistor, and increase the yield in the fabrication of the thin film transistor.

Figure 5G:
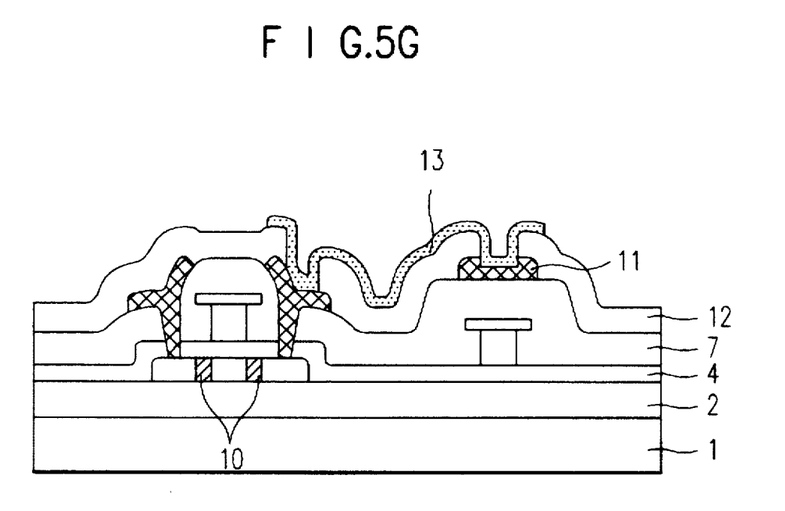

FIG. 5G shows another structure for the storage capacitor according to the third embodiment of the present invention. In this case, a portion of the upper storage electrode is removed (similar to FIG. 4G) and the pixel electrode 13 fills the removed portion of the upper storage electrode 11, and preferably, to about one-half the distance into the upper storage electrode 11.

Figure 5H:
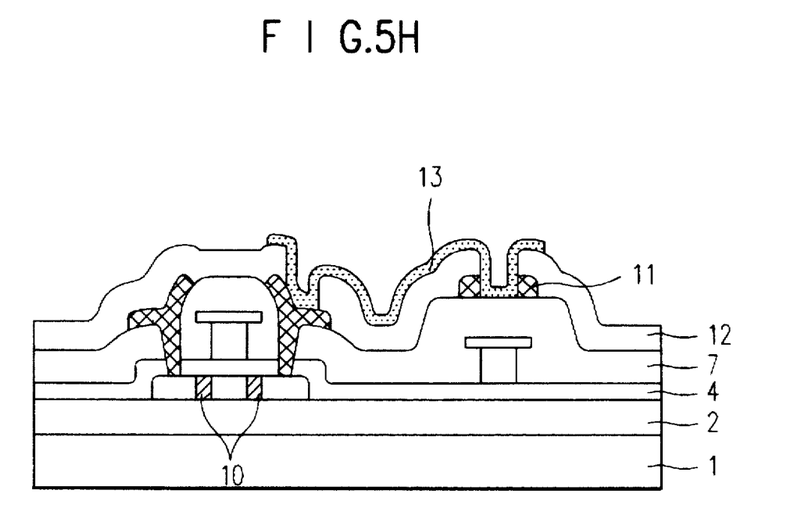

FIG. 5H shows still another structure for the storage capacitor according to the third embodiment of the present invention. In this case, a hole is formed by etching, for example, in the upper storage electrode 11 to expose a portion of the interlayer insulation layer 7, and the pixel electrode 13 goes through the hole to the interlayer insulating layer 7. The materials of the interlayer insulating layer 7 and the upper storage electrode 11 and/or the etching method are preferably chosen such that the etch selectivity of the upper storage electrode 11 to the interlayer insulating layer 7 is high. Thus, it is possible to etch through the upper storage electrode 11 (forming the hole) and up to the interlayer insulating layer 7.

Throughout this specification, the phrase "offset structure" also applies to a lightly doped drain (LLD) structure. For example, in the above-mentioned ion-doping process, impurities can be lightly doped into the offset region so as to create an LLD structure for the present invention.

It will be apparent to those skilled in the art that various modifications and variations can be made in the liquid crystal display and method for fabricating the same of the present invention without departing from the spirit or scope of the invention. Thus, it is intended that the present invention cover the modifications and variations of this invention provided they come within the scope of the appended claims and their equivalents.

What is claimed is:

1. A thin film transistor comprising:

a substrate;

an active layer over the substrate, the active layer having a channel region, source and drain regions, and an offset region;

a gate insulating layer over the active layer;

a lower gate electrode having a first width over the gate insulating layer; and an upper gate electrode over the lower gate electrode, the second width being different from the first width;

an interlayer insulating layer on an overall surface of the substrate including the active layer, the gate insulating layer, and the lower and upper gate electrodes, the interlayer insulating layer having a contact hole exposing the source and drain regions of the active layer; and source and drain electrodes connected to the source and drain regions through the contact hole.

2. The liquid crystal display according to claim 1, further comprising a buffer layer between the substrate and the active layer.

3. The liquid crystal display according to claim 1, wherein each of the upper and lower electrodes includes a material selected from the group consisting of Al, TiSi$_x$, Cr, Ta, and Mo.

4. The liquid crystal display according to claim 1, wherein the gate insulating layer is wider than the lower gate electrode.

5. The liquid crystal display according to claim 4, wherein the gate insulating layer has a protruding portion protruding from at least one edge of the lower gate electrode by a third width.

6. The liquid crystal display according to claim 5, wherein the offset region is located below the protruding portion of the lower gate electrode.

7. The liquid crystal display according to claim 1, wherein the second width of the upper gate electrode is wider than the first width of the lower gate electrode.

8. The liquid crystal display according to claim 7, wherein the upper gate electrode has a protruding portion protruding from at least one edge of the lower gate electrode by a third width.

9. The liquid crystal display according to claim 8, wherein the offset region is located below the protruding portion of the upper gate electrode.

10. The liquid crystal display according to claim 8, wherein the gate insulating layer has a protruding portion from at least one edge of the lower gate electrode by a fourth width.

11. The liquid crystal display according to claim 10, wherein the protruding portion of the gate insulating layer is located directly below the protruding portion of the upper gate electrode.

12. The liquid crystal display according to claim 11, wherein the offset region is located below the protruding portion of the gate insulating layer.

13. A method for fabricating a liquid crystal display including a thin film transistor having a substrate, the method comprising the steps of:

forming an active layer on the substrate;

forming an insulating layer on the substrate and the active layer;

forming a first conductive layer on the insulating layer;

forming a second conductive layer over the first conductive layer;

selectively etching the first and second conductive layers to form lower and upper gate electrodes;

patterning the insulating layer to form a gate insulating layer using the upper gate electrode as a mask; and doping ions in the active layer to form source and drain regions for the thin film transistor by using the upper gate electrode as a mask.

14. The method for fabricating a liquid crystal display according to claim 13, the method further comprising the steps of forming an interlayer insulating layer on an overall surface of the substrate;

selectively etching the interlayer insulating layer to form a contact hole exposing a portion of the source and drain regions;

forming a metal layer over an overall surface of the interlayer insulating layer; and patterning the metal layer to form source and drain electrodes connected to the source and drain regions through the contact hole.

15. The method for fabricating a liquid crystal display according to claim 13, wherein the step of etching the first and second conductive layers and the step of patterning the insulating layer are sequentially carried out by using a single mask defining the upper gate electrode pattern.

16. The method for fabricating a liquid crystal display according to claim 13, wherein the etching step of the first and second conductive layers includes etching the first conductive layer more than the second conductive layer.

17. A method for fabricating a liquid crystal display having a thin film transistor and a storage capacitor, the method comprising the steps of:

forming an active layer on a substrate;

forming an insulating layer on the substrate and the active layer;

forming a first conductive layer on the insulating layer;

forming a second conductive layer over the first conductive layer;

selectively etching the first and second conductive layers to form lower and upper gate electrodes and first and second storage electrodes;

doping ions in the active layer to form source and drain regions for the thin film transistor by using the upper gate electrode as a mask;

forming an interlayer insulating layer over a first overall surface of the substrate;

selectively etching the interlayer insulating layer to form a contact hole exposing a portion of the source and drain regions;

forming a metal layer over an overall surface of the interlayer insulating layer;

patterning the metal layer to form source and drain electrodes connected to the source and drain regions through the contact hole, and to form an upper storage electrode;

forming a protective layer over a second overall surface of the substrate;

selectively etching portions of the protective layer to expose a portion of one of the source and drain electrodes and the upper storage electrode; and forming a pixel electrode on the protective layer including the selectively etched portions of the protective layer.

18. The method for fabricating a liquid crystal display according to claim 17, the method further comprising, between the step of etching the first and second conductive layers and the step of doping ions, the step of patterning the insulating layer to form a gate insulating layer using the upper gate electrode as a mask.

19. The method for fabricating a liquid crystal display according to claim 18, wherein the step of etching the first and second conductive layers and the step of pattering the insulating layer are sequentially carried out by using a single mask defining the upper gate electrode pattern and the second storage electrode.

20. The method for fabricating a liquid crystal display according to claim 17, wherein the etching step of the first and second conductive layers includes etching the first conductive layer more than the second conductive layer.

21. The method for fabricating a liquid crystal display according to claim 17, the method further comprising, between the step of etching the protective layers and the step of forming the pixel electrode, the step of etching at least a portion of the exposed portion of the upper storage electrode.

22. The method for fabricating a liquid crystal display according to claim 21, wherein the step of etching the exposed portion of the upper storage electrode includes the step of etching the upper storage electrode to expose a portion of the interlayer insulating layer.

23. A liquid crystal display comprising:

a thin film transistor section including:

a substrate;

an active layer over the substrate, the active layer having a channel region, source and drain regions, and an offset region;

a first insulating layer portion over the active layer;

a lower gate electrode having a first width over the first insulating layer portion; and an upper gate electrode having a second width over the lower gate electrode, the second width being different from the first width;

a storage capacitor section adjacent the thin film transistor section including:

the substrate;

a second insulating layer portion over the substrate;

a first storage electrode having a third width over the second insulating layer portion; and a second storage electrode having a fourth width over the first storage electrode, the fourth width being different from the third width;

an interlayer insulating layer on an overall surface of the substrate including the active layer, the insulating layer, the lower and upper gate electrodes, and the first and second storage electrodes, the interlayer insulating layer having first contact holes exposing the source and drain regions of the active layer, respectively;

source and drain electrodes on the interlayer insulating layer and connected to the source and drain regions through the first contact holes;

an upper storage electrode on the interlayer insulating layer over the first and second storage electrodes;

a protective layer over the interlayer insulating layer, the source and drain electrodes, and the upper storage electrode, the protective layer having second contact holes to expose a portion of one of the source and drain electrodes and a portion of the upper storage electrode; and a conducting material on the protective layer and contacting the portion of the one of the source and drain electrodes and the portion of the upper storage electrode through the second contact holes.

24. The liquid crystal display according to claim 23, wherein the upper storage electrode has a portion removed and the conducting material fills at least a portion of the removed portion.

25. The liquid crystal display according to claim 23, wherein the upper storage electrode has a hole to expose a portion of the interlayer insulating layer and the conducting material contacts the interlayer insulating layer through the hole of the upper storage electrode.

26. The liquid crystal display according to claim 23, wherein the second width of the upper gate electrode is wider than the first width of the lower gate electrode.

27. The liquid crystal display according to claim 23, wherein each of the upper and lower electrodes includes a material selected from the group consisting of Al, $TiSi_x$, Cr, Ta, and Mo.

28. The liquid crystal display according to claim 23, wherein the insulating layer is wider than the lower gate electrode.

29. The liquid crystal display according to claim 28, wherein gate insulating layer has a protruding portion protruding from at least one edge of the lower gate electrode by a third width.

30. The liquid crystal display according to claim 29, wherein the offset region is located below the protruding portion of the lower gate electrode.

31. The liquid crystal display according to claim 23, wherein the upper gate electrode has a protruding portion protruding from at least one edge of the lower gate electrode by a third width.

32. The liquid crystal display according to claim 31, wherein the offset region is located below the protruding portion of the upper gate electrode.

33. The liquid crystal display according to claim 31, wherein the insulating layer has a protruding portion from at least one edge of the lower gate electrode by a fourth width.

34. The liquid crystal display according to claim 33, wherein the protruding portion of the insulating layer is located directly below the protruding portion of the upper gate electrode.

35. The liquid crystal display according to claim 34, wherein the offset region is located below the protruding portion of the insulating layer.

* * * * *